United States Patent
Chu et al.

(10) Patent No.: US 11,909,404 B1
(45) Date of Patent: Feb. 20, 2024

(54) DELAY-LOCKED LOOP OFFSET CALIBRATION AND CORRECTION

(71) Applicant: Advanced Micro Devices, Inc., Santa Clara, CA (US)

(72) Inventors: Andy Huei Chu, Saratoga, CA (US); Karthik Gopalakrishnan, Cupertino, CA (US); Pradeep Jayaraman, San Jose, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 18/079,252

(22) Filed: Dec. 12, 2022

(51) Int. Cl.
  *H03L 7/081* (2006.01)
  *H03L 7/189* (2006.01)
  *H03L 7/087* (2006.01)

(52) U.S. Cl.
  CPC .......... *H03L 7/0818* (2013.01); *H03L 7/087* (2013.01); *H03L 7/189* (2013.01)

(58) Field of Classification Search
  CPC ........ H03L 7/0818; H03L 7/087; H03L 7/189
  See application file for complete search history.

(56) References Cited

U.S. PATENT DOCUMENTS

| | | | | |
|---|---|---|---|---|
| 7,020,793 B1* | 3/2006 | Hsieh | .............. | H03L 7/0812 713/400 |
| 9,184,909 B1* | 11/2015 | McCracken | ............ | H04L 7/042 |
| 2003/0184355 A1* | 10/2003 | Lee | .............. | H03L 7/087 327/158 |
| 2005/0083138 A1* | 4/2005 | Hasegawa | .............. | H03L 7/087 331/156 |
| 2010/0327926 A1* | 12/2010 | Takahashi | .............. | G11C 7/222 327/158 |
| 2011/0204942 A1* | 8/2011 | Abe | .............. | H03L 7/0814 327/158 |
| 2017/0032010 A1* | 2/2017 | Merriman | .............. | G06F 16/27 |
| 2021/0075430 A1* | 3/2021 | Han | .............. | H03L 7/0816 |
| 2021/0305989 A1* | 9/2021 | Han | .............. | H03K 5/14 |
| 2022/0027221 A1* | 1/2022 | Glade | .............. | G06F 11/2094 |
| 2022/0221893 A1* | 7/2022 | Wang | .............. | H03L 7/0814 |
| 2023/0308103 A1* | 9/2023 | Han | .............. | H03L 7/0895 327/157 |

FOREIGN PATENT DOCUMENTS

| | | | | |
|---|---|---|---|---|
| JP | 2007266935 A | * | 10/2007 | ............. H03L 7/087 |
| KR | 20010034111 A | * | 4/2001 | |

* cited by examiner

*Primary Examiner* — Adam D Houston
(74) *Attorney, Agent, or Firm* — Polansky & Associates, P.L.L.C.; Paul J. Polansky; Nathan H. Calvert

(57) ABSTRACT

A clocking circuit is provided using a master delay-locked loop (DLL) and a slave DLL. A master DLL code indicates a delay adjustment made at a master DLL. A delay of a slave DLL is adjusted based on the master DLL code. A replica phase detector at the slave DLL is temporarily enabled during an interface idle period. A slave DLL code is determined, and a configuration value is determined based on the slave DLL code to the master DLL code. The replica phase detector is then disabled.

20 Claims, 4 Drawing Sheets

DELAY-LOCKED LOOP OFFSET CALIBRATION AND CORRECTION

BACKGROUND

In order for a memory controller such as a dynamic random-access memory (DRAM) controller to correctly acquire the data being sent from the DRAM, the DRAM controller typically often uses a delay-locked loop (DLL) circuit adjust a read clock or strobe signal from the DRAM so that it can be used to correctly latch the incoming data (DQ) signals. For similar reasons, the DRAM controller also utilizes DLL circuits to cause the outgoing data to be centered on transitions of a write clock at the memory.

A DLL locks to a reference clock signal to keep the delay of the DLL output signal substantially constant over process, voltage, and temperature variations. Some DLLs continuously maintain lock to a reference signal, whereas others intermittently lock to a reference signal while continuously using the voltage of a loop filter to set their delay, since this voltage changes slowly.

In some DRAM systems, such as graphics double data rate (GDDR) systems, the read clock is configured as a strobe which is only activated to accomplish read commands, and otherwise is idled to save power on the DRAM interface. A DLL is typically used at the receiver for each data lane to provide a consistent clock signal based on a received read clock. During the idle periods, when no read clock signal is received, the DLL typically does not operate and therefore the voltage and temperature conditions of the receiver's DLL can drift far from their original values without any compensation. Such a drift makes it more time consuming and difficult to maintain a lock at the DLL.

Figures 1, 2:
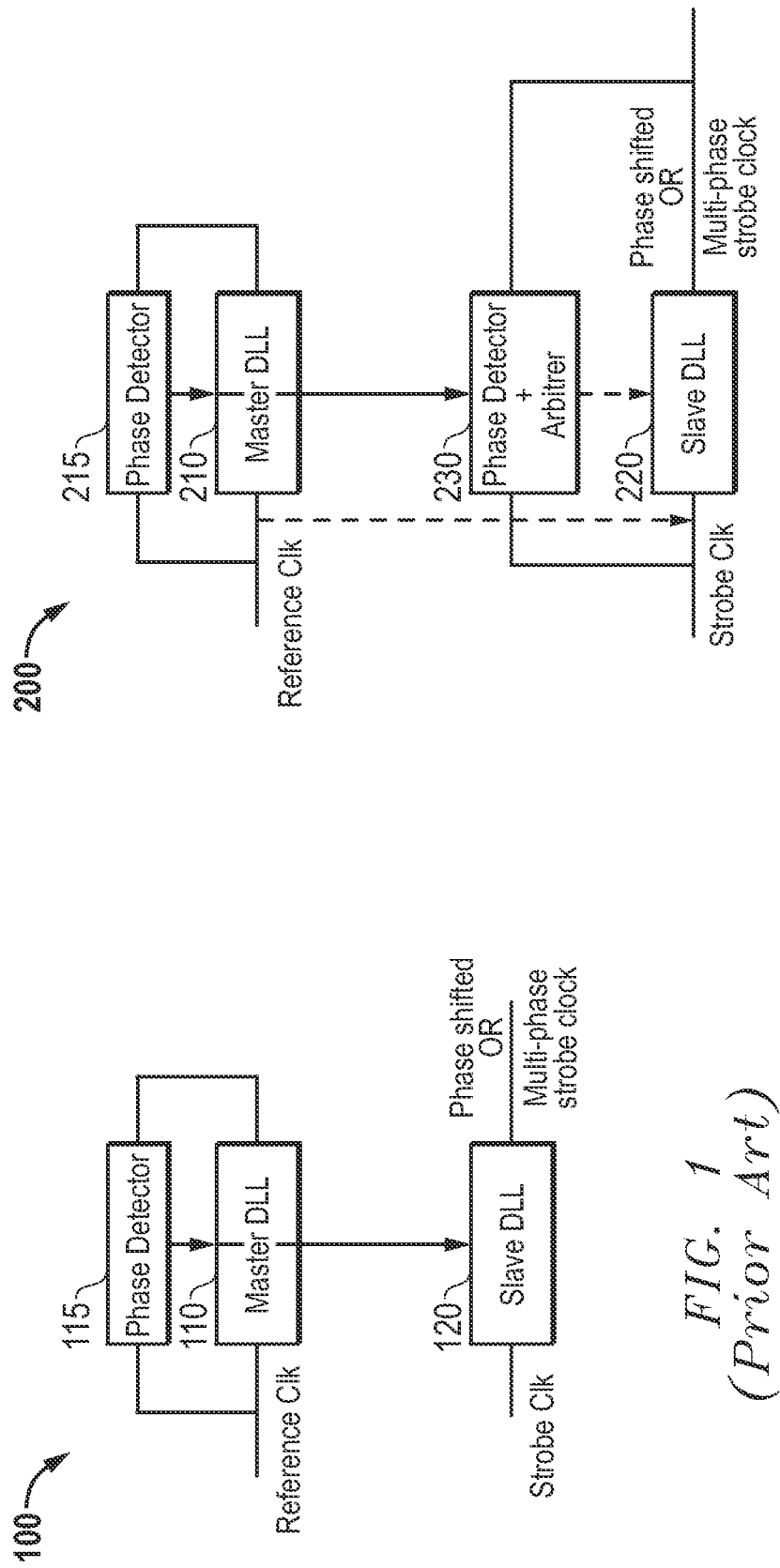
FIG. 1 illustrates in block diagram form a delay-locked loop (DLL) clocking circuit according to the prior art.
FIG. 2 illustrates in block diagram form a DLL clocking circuit 200 according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A clocking circuit for a communication link includes a master delay-locked loop (DLL) circuit, a slave DLL circuit, and an arbiter circuit. The master DLL circuit includes a plurality of delay elements arranged in series between an input and an output, and a phase detector circuit coupled to the input and output for detecting a phase offset and providing a master DLL code for adjusting the delay elements of the master DLL. The slave DLL circuit provides an oscillator signal to a receiver of the communication link. The slave DLL includes a plurality of delay elements arranged in series between an input and an output, and a replica phase detector circuit for detecting a phase offset and providing a slave DLL code for adjusting the delay elements of the slave DLL. The arbiter circuit is operable to temporarily enable the replica phase detector of the slave DLL during an idle period of the communication link to update a configuration value based on the master DLL code and the slave DLL code, and to adjust the delay elements of the slave DLL during an active period of the communication link based on the configuration value and the master DLL code.

A method is provided for operating an interface circuit. The method includes providing a master delay-locked loop (DLL) lock value indicating a delay adjustment made at a master DLL. The method includes adjusting a delay of a slave DLL based on the master DLL code. The method includes temporarily enabling a replica phase detector at the slave DLL during an interface idle period, determining a slave DLL code, determining a configuration value based on the slave DLL code to the master DLL code, and then disabling the replica phase detector.

A data processing system includes a data processor, a memory coupled to the data processor by a communication link, a clocking circuit for the communication link. The clocking circuit includes a master DLL circuit, a slave DLL circuit, and an arbiter circuit. The master DLL circuit includes a plurality of delay elements arranged in series between an input and an output, and a phase detector circuit coupled to the input and output for detecting a phase offset and providing a master DLL code for adjusting the delay elements of the master DLL. The slave DLL circuit provides an oscillator signal to a receiver of the communication link. The slave DLL includes a plurality of delay elements arranged in series between an input and an output, and a replica phase detector circuit for detecting a phase offset and providing a slave DLL code for adjusting the delay elements of the slave DLL. The arbiter circuit is operable to temporarily enable the replica phase detector of the slave DLL during an idle period of the communication link to update a configuration value based on the master DLL code and the slave DLL code, and to adjust the delay elements of the slave DLL during an active period of the communication link based on the configuration value and the master DLL code.

FIG. 1 illustrates in block diagram form a delay-locked loop (DLL) clocking circuit 100 according to the prior art. DLL clocking circuit 100 includes a primary or master DLL 110, a phase detector 115, and a secondary or slave DLL 120.

Generally, slave DLL 120 has an input receiving a strobe clock such as a GDDR read clock (RCK), an input receiving a lock code from phase detector 115, and an output providing a phase-shifted or multi-phase version of the strobe clock. Master DLL 110 has an input receiving a reference clock generally set at the expected frequency of the strobe clock, an input receiving a lock code from phase detector 115, and an output connected to an input of phase detector 115. Phase detector 115 detects a phase difference between the input and output of master DLL 110, and provides the phase lock code to control one or more delay elements in master DLL 110 in order to stabilize the phase of master DLL 110. The phase lock code is then used to stabilize slave DLL 120 without the need for a phase detector at slave DLL 120. Generally, multiple slave DLLs are located near master DLL 110 and connected to phase detector 115 to receive the phase lock code. This architecture allows multiple slave DLLs to each provide a clock signal to a local circuit, generally a receiver circuit, without each having a phase detector circuit.

DLL clocking circuit 100 is often used for communication interfaces such as a memory interface in which a read or write clock operates burst mode or strobe mode operation, to improve power efficiency. Specifically, to improve the power efficiency, the clocks are turned off in the low power state or the idle mode in which there no transmission or transmission or reception of data. However, the slave DLL clocks must be turned back on as quickly as possible during the transition from the idle state to the active mode. This fast turn-on of clocks during idle mode exit to active mode is one of the major design challenges of a burst mode system. In the depicted traditional slave DLL implementation, slave DLL 120 operates as an open loop circuit by using the lock code from the master DLL in both active mode and the idle state. As a result, the traditional implementation of the open loop slave DLL can have a significant offset between the master and the slave DLLs that can introduce a timing error or clock integrity issues due to factors such as random device mismatch, supply/ground voltage difference, and thermal gradient difference. These factors may change over time as the circuit operates.

FIG. 2 illustrates in block diagram form a DLL clocking circuit 200 according to some embodiments. DLL clocking circuit 200 includes a primary or master DLL 110, a phase detector 215, a secondary or slave DLL 220, and a replica phase detector and arbiter circuit 230. DLL clocking circuit 200 is generally embodied in a physical layer circuit (PHY) of an integrated circuit such as a system-on-chip, a data processor, or a graphics processor, in order to provide clock signals for interface circuits such as a memory bus interfaces.

Master DLL 210 has an input receiving a reference clock labeled "Reference Clk", an input receiving a lock code from phase detector 215, and an output providing a delayed version of the input signal to an input of phase detector 215. Phase detector 215 detects a phase difference between the input and output of master DLL 210, and provides the phase lock code to control one or more delay elements in master DLL 210 in order to stabilize the phase of master DLL 210.

Slave DLL 220 has an input receiving a strobe clock labeled "Strobe Clk", such as a GDDR read clock (RCK), and an output providing a phase-shifted or multi-phase version of the strobe clock labeled "Phase shifted Or Multiphase strobe clock". Replica phase detector and arbiter circuit 230 includes two inputs connected to the input and output of slave DLL 220, an input receiving a lock code from phase detector 215, and an output connected to slave DLL 220.

In operation, DLL clocking circuit 200 activates the duplicate phase detector to temporarily create a local replica feedback loop through phase detector and arbiter circuit 230 for slave DLL 220 to perform offset correction calibration in order to cancel the offset between master DLL 210 and slave DLL 220 for improved performance. The arbiter circuit is operable to temporarily enable the replica phase detector both during initial calibration and during an idle period of the communication link to update a configuration value based on the master DLL lock code and the slave DLL lock code. The reference clock is fed to slave DLL 220's input to perform the initial calibration and to update the configuration value. The replica phase detector is then disabled, and the reference clock signal removed. During an active period of the communication link, when the strobe clock signal is present, the delay elements of the slave DLL are adjusted based on the configuration value and the master DLL code.

While one slave DLL is shown, typically many are present and coupled to master DLL 210 in the same manner to perform such calibration. The local replica feedback loop for slave DLL 220 can also be turned on continuously in active mode when the input strobe clock is available while the loop can be open in idle mode without an input clock. The arbiter circuit of replica phase detector and arbiter circuit 230 is used to combine the information from slave DLL 220's offset correction loop with the locked information from master DLL 210 to reduce or cancel the offset between the two DLLs for better performance.

In some embodiments, DLL clocking circuit 200 is also able to perform continuous slave DLL offset correction in active state. The local replica feedback loop through replica phase detector and arbiter circuit 230 is turned on continuously in the active state when the input strobe clock is available, whereas the replica loop is disabled in idle mode without an input strobe clock. Slave DLL 220 relies on the locked information update from master DLL 210 in idle mode because the feedback loop of slave DLL 220 is open.

Figure 3:
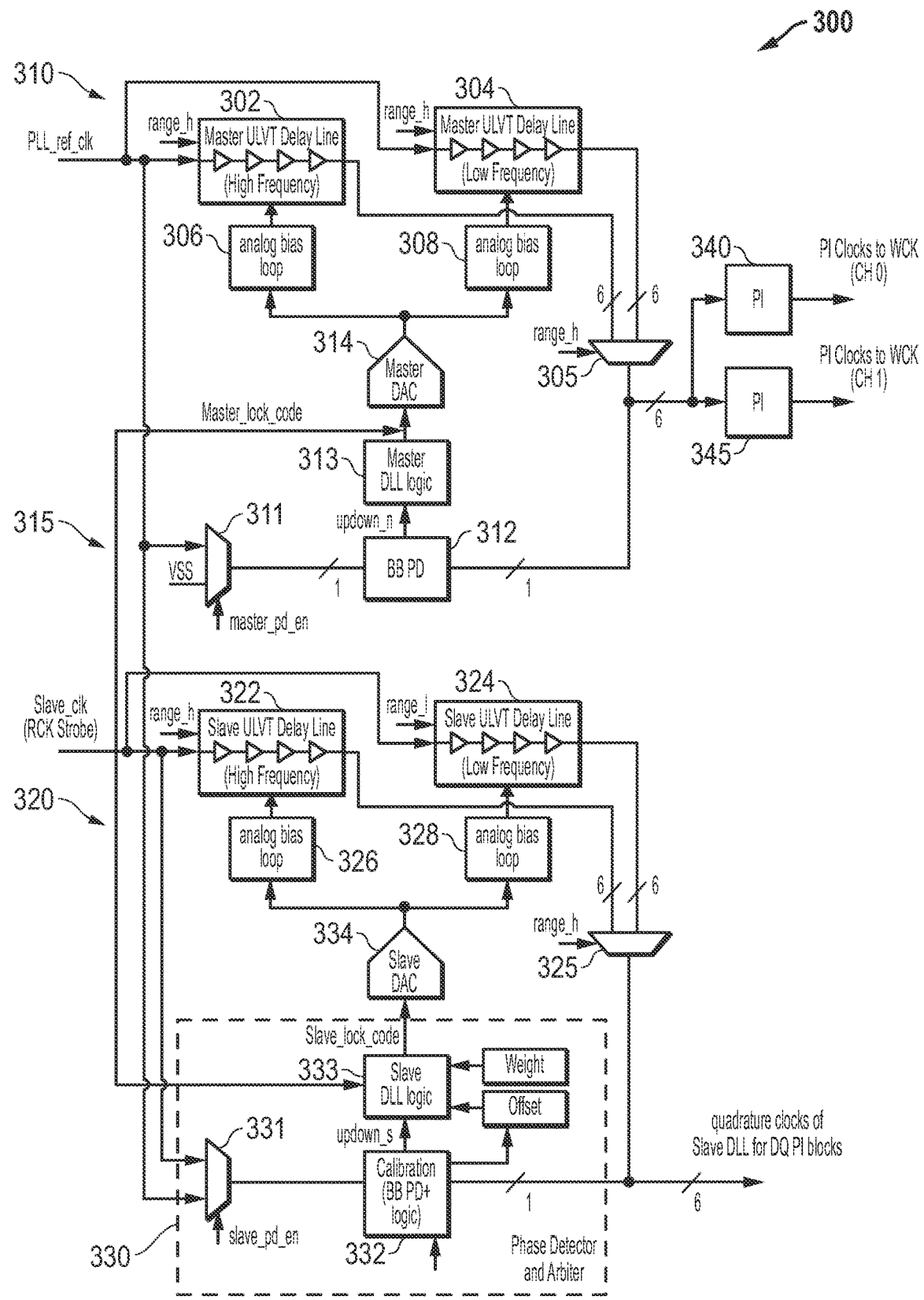
FIG. 3 illustrates in mixed circuit diagram and block diagram form a DLL clocking circuit according to some embodiments.

FIG. 3 illustrates in mixed circuit diagram and block diagram form a DLL clocking circuit 300 according to some embodiments. DLL clocking circuit 300 includes a primary or master DLL 310, a phase detector 315, a secondary or slave DLL 320, and a phase detector and arbiter circuit 330. DLL clocking circuit 300 is shown coupled to two phase interpolator (PI) blocks 340 and 345 to illustrate how the master DLL 310's output signal may also be employed in some embodiments. DLL clocking circuit 300 is one example implementation of the circuit 200 of FIG. 2, and is embodied on an integrated circuit.

Master DLL 310 includes a first delay line 302, a second delay line 304, a multiplexer 305, two analog bias loop circuits 306 and 308, and a master digital-to-analog converter (DAC) 314. Master DLL 310 includes an input receiving a reference clock signal "PLL_ref_clk", an input receiving a range selection signal labeled "range_h", an input receiving a range selection signal labeled "range_l", and an output.

First delay line 302, in this embodiment, is an ultra-low voltage threshold (ULVT) delay line including a number of delay elements, which are typically a series of complimentary metal-oxide semiconductor (CMOS) inverters constructed with ULVT transistors. First delay line 302 is used for higher frequency clock signals and has an input receiving an enable signal labeled "range_h". Second delay line 304 is a low voltage threshold (LVT) delay line including a number of delay elements constructed with LVT transistors, and has an input receiving an enable signal labeled "range_l". The PLL_ref_clk signal is fed to the input of first delay lines 302 and second delay line 304. The outputs of each delay line, in this example a group of five clock signals each at different phases, are fed to multiplexer 305, which selects which group is passed to the PLL output based on the value of the range_h signal. While in this implementation, two separate delay lines are used for high and low frequencies, in other embodiments where a narrow range of operation is expected, a single delay line may be used. Further, while two different types of devices are shown in this implementation (LVT and ULVT), in other implementations, second delay line 304 may also be implemented with ULVT transistors having longer channel lengths than those of first delay line 302.

Master DAC 314 has an input connected to master DLL logic 313, and an output connected to inputs of analog bias loop 306 and analog bias loop 308. Analog bias loop 306 produces analog bias voltages which are fed to the delay elements of first delay line 302. Similarly, analog bias loop 308 produces analog bias voltages which are fed to the delay elements of first delay line 304. Separate analog bias voltages are provided for both the p-type and n-type portions of the delay elements, in order to adjust the delay of the delay elements.

Phase detector 315 includes a multiplexer 311, and a "bang-bang" (BB) phase detector 312, a master DLL logic circuit 313, and an input receiving an enable signal labeled "master_pd_en". Multiplexer 311 has an input receiving the PLL_ref_clk signal, an input tied to the ground or VSS voltage, and an output which selectively passes one of the inputs based on the value of the enable signal master_pd_en. BB phase detector 312 has an input connected to the output of multiplexer 311, an input connected to an initial output (phase 0) of multiplexer 305, and an output providing an up-down signal labeled "updown_m". Master DLL logic 313 has an input receiving the updown_m signal, and an output connected to the input of master DAC 314 for providing a master lock code signal labeled "Master_lock_code". Master DLL logic 313 includes digital circuitry for lowpass filtering the updown_m signal and producing a lock code, which indicates in digital form the DAC input that produces a lock for master DLL 310.

Slave DLL 320 includes a first delay line 322, a second delay line 324, a multiplexer 325, two analog bias loop circuits 326 and 328, and a slave digital-to-analog converter (DAC) 334. Slave DLL 320 also includes an input receiving a clock or strobe signal "Slave_clk", an input receiving the range selection signal range_h, an input receiving the range selection signal range_l, and an output.

Slave DLL 320 is preferably constructed similarly to master DLL 310, with first delay line 322 implemented as a ULVT delay line including a number of delay elements, which are typically CMOS inverters. First delay line 322 is used for higher frequency clock signals and has an input receiving the enable signal labeled range_h. Second delay line 324 is a LVT delay line including a number of delay elements, and has an input receiving the enable signal labeled range_l. The Slave_clk signal is fed to the input of first delay lines 322 and second delay line 324. The outputs of each delay line, in this example a group of five clock signals each at different phases, are fed to multiplexer 325, which selects which group is passed to the PLL output based on the value of the range_h signal. As shown on the right, in this implementation the multi-phase output of Slave DLL 320 provides quadrature clock signals to PI circuits of DQ receivers in a memory interface PHY circuit. In other implementations, the output of Slave DLL 320 may feed other interface circuits with clocking signals.

Phase detector and arbiter circuit 330 includes a multiplexer 331, a calibration circuit 332, a slave DLL logic circuit 333, an offset register labeled "Offset", and a weight register labeled "Weight", an input receiving the lock code signal Master_lock_code, an input receiving the Slave_clk signal, an input receiving the PLL_ref_clk signal, and an input receiving an enable signal labeled "slave_pd_en".

Multiplexer 331 has an input receiving the PLL_ref_clk signal, an input receiving the Slave_clk signal, and an output which selectively passes one of the inputs based on the value of the enable signal slave_pd_en. Calibration circuit 332 has an input connected to the output of multiplexer 331, an input connected to an initial output (phase 0) of multiplexer 325, and an output providing an up-down signal labeled "updown_s". Calibration circuit 332 includes a replica BB phase detector which is used, during calibration and calibration updates, to perform phase detection with the PLL_ref_clk signal similarly to BB phase detector 312 and produce a calibration value. In this implementation the calibration value is an offset value, which is stored in the Offset register, as further described below. Calibration circuit 332 is also able continuous closed loop operation using the Slave_clk signal in situations where open loop operation is not desired—that is, it can allow slave DLL 320 to perform as a normal DLL, not a slave DLL.

Slave DLL logic circuit 333 has an input receiving the Master_lock_code, an input receiving the updown_s signal, an input connected to the Offset register, an input connected to the Weight register, and an output connected to the input of master DAC 314. Slave DLL logic 333 includes digital circuitry for, during the calibration and update process, lowpass filtering the updown_s signal and producing a lock code, which indicates in digital form the DAC input that produces a lock for slave DLL 320. This circuitry is also active during closed loop operation in some implementations. The circuitry measures and stores the difference between the Master_lock_code and the Slave_lock_code in closed loop operation when the replica slave DLL phase detector is enabled. Slave DLL logic 333 includes digital circuitry for, during open loop operation, applying the value from the Offset register to offset the value of the Master_lock_code to produce a value for the Slave_lock_code for open loop operation. In this operation, the value of the Offset is added to the value of Master_lock_code. In some implementations, the value in the Weight register is also used to scale the Offset value before adding. The value in the Weight register is preferably determined by characterization of the circuit during manufacturing or an initial training process, but in some implementations may also be updated by a training process during operation.

Figure 4:
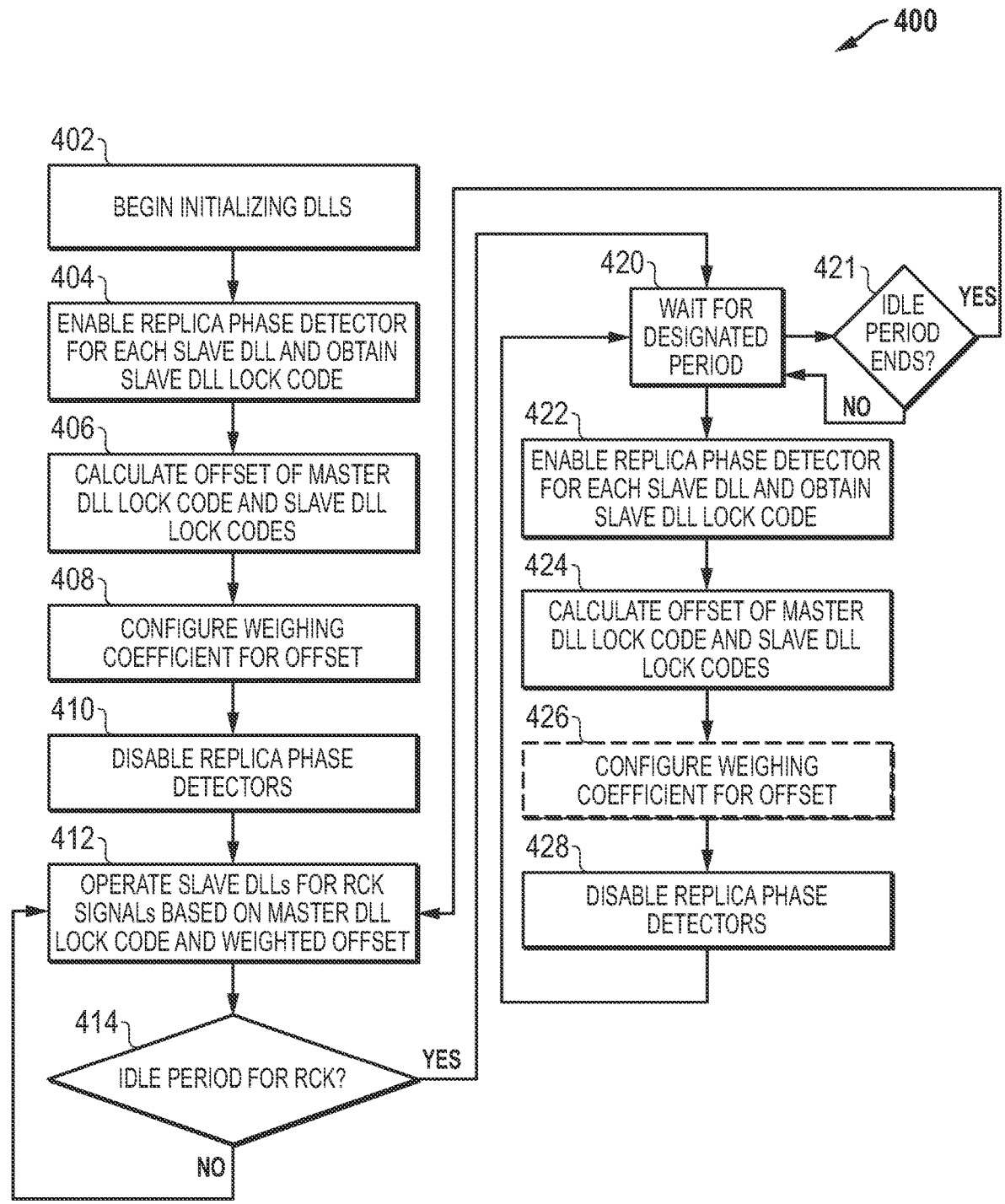
FIG. 4 shows a flowchart of a process for operating a DLL clocking circuit according to some embodiments.

The operation of DLL clocking circuit 300 is further described with respect to the flowchart of FIG. 4, which shows a flowchart 400 of a process for operating a DLL clocking circuit according to some embodiments. The depicted process is implemented by a DLL clocking circuit such as those shown in FIG. 2 or FIG. 3, or other suitable clocking circuits, under control of a power state controller or initialization controller which controls initialization of the related PHY circuit for which the slave DLL's provide clock signals. The process is performed during initialization and operation of the related PHY circuit.

At block 402, the process begins initializing and calibrating the master DLL and slave DLLs that are controlled by the master DLL. At block 404, the process enables the replica phase detector for each slave DLL for operation in the closed loop mode, and obtains a slave DLL lock code from closed loop mode operation. This calibration is performed with the Slave_clk signal active.

At block 406, the process calculates an offset between the master DLL lock code and the slave DLL lock code. This offset is saved to the Offset register (FIG. 3) or other suitable storage circuit that is maintained during idle periods of the related communication link, which in this example implementation is the DQ receive circuitry. While an offset value is shown here, another suitable configuration value may be calculated based on the master DLL lock code and the slave DLL lock code, such as a fractional ratio or a percentage. Offsets are unique to each slave DLL. In some embodiments, the process has the capability to produce a negative value for the offset for use with a bidirectional mode in which a the slave DLL provides a lock code used by the master.

At block 408, a weighing coefficient such as that in the Weight register (FIG. 3) may also be configured. This operation may include loading a weighing coefficient value from firmware, or calculating such a value based on training. Some implementations may not use a weighing coefficient. The weighing coefficient values are preferably unique to each slave DLL because they depend on local voltage, temperature, and process variations at and around each slave DLL circuit.

At block 410, the process disables the replica phase detectors of the slave DLLs and places the slave DLLs in open loop mode operation. At block 412, the slave DLLs, in this example for RCK signals provided to receiver circuits of the PHY, are operated in open loop mode with the DLL adjustment performed based on the master DLL lock code and the Offset and Weight values determined during the calibration process. This open loop mode operation continues until the process at block 414 enters an idle period for the RCK signal, which means no read operations are taking place and the RCK strobe signal is stopped. While use with an RCK signal is described here, the process may also be used with other interface circuit clock signals as discussed above.

When an idle period is entered at block 414, the process goes to block 420 where the slave DLL is not operated because no RCK signal is provided. At block 420, the process waits for a designated period, and then enters a periodic calibration mode in which the Offset values for slave DLLs are updated (blocks 422 through 428). If the idle period ends while waiting in the idle mode, the process at block 421 returns to block 412 for open loop operation of the slave DLLs with the latest Offset value. It is noted that the idle times may vary by a large multiple during operation, and so thermal and voltage conditions may change a lot during an idle period. The idle period is preferably configured to capture an ordinary time period over which thermal and voltage conditions change.

After the designated period, the process goes to block 422 where it begins a configuration update similar to the original configuration of the slave DLLs. The replica phase detectors are enabled and the master DLL reference clock (for example, PLL_ref_clk of FIG. 3) is fed to the slave DLLs. This updated value is saved to the Offset register. At block 424, the offset between the master and slave DLL lock codes is calculated. At an optional block 426, the weighing coefficient may be updated. Following the configuration update, the process returns to block 420 where it waits for the idle period to end or for another periodic configuration update to be become due.

Figure 5:
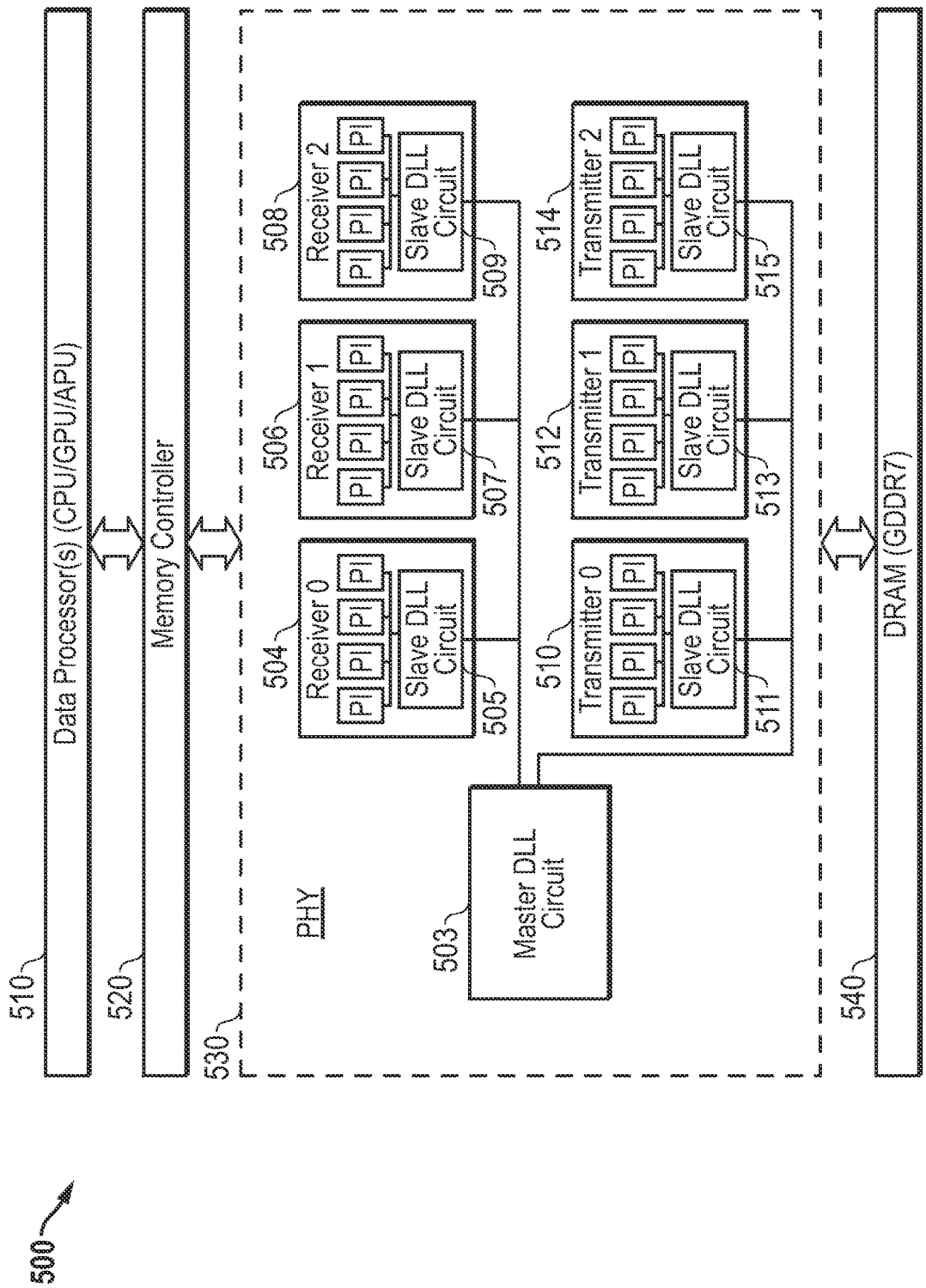
FIG. 5 illustrates in block diagram form a portion of a data processing system 500 according to some embodiments.

FIG. 5 illustrates in block diagram form a portion of a data processing system 500 according to some embodiments. The depicted portion of a data processing system includes one or more data processors 501 such as central processing units (CPUs), graphics processing units (GPUs), or accelerated processing units (APUs). Data processors 500 access a DRAM 540, for example a GDDR7 DRAM, through a memory controller 520 and a PHY circuit 530. PHY circuit 530 includes a master DLL circuit 503, three receiver circuits 504, 506, and 508, and three transmitter circuits 510, 512, and 514, all for a particular memory channel. Master DLL circuit 503 may also supply clocking signals for one or more additional memory channels. Various other parts of the circuit are not included to avoid obscuring the clocking arrangement.

Each of receivers 504, 506, and 508 includes four phase interpolators labeled "PI". Slave DLL circuits 505, 507, and 509 supply clocking signals to the PIs in their respective receivers. Similarly, in this embodiment, each of transmitters 510, 512, and 514 includes four phase interpolators labeled "PI". Slave DLL circuits 511, 513, and 515 supply clocking signals to the PIs in their respective transmitters.

The depicted slave DLL circuits 505, 507, and 509 are constructed according to those of FIG. 2 or FIG. 3. The transmitter slave DLL circuits may be constructed similarly, or to operate in an open loop arrangement only.

Slave DLL circuits 505, 507, and 509 each perform the process of FIG. 4 to update their calibration during idle periods of the receivers, when no read clock signal is present. In some embodiments, the control signals for DLL replica for the receiver and transmitter slave DLL replica PDs can be generated responsive to read and write commands, respectively, being dispatched from memory controller 520.

Thus, a clocking circuit, a system, and a method have been described in which a local arbiter is used to combine the information from local slave DLL offset correction loop with the locked information from the master DLL to effectively cancel the offset between the two DLLs and track the supply and temperature drift in an idle mode for better performance. While this example application of the circuits and techniques is provided herein, the same techniques are applicable to other receiver and transmitter circuits.

DLL clocking circuit 200, DLL clocking circuit 300, or any portion thereof, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, other communication links that benefit from slave DLL circuits may employ the circuits and processes herein. Further, while the circuit is useful for clocking a strobed clock signal such as the RCK signal used in various GDDR memory standards, the circuit herein may be used for non-strobed signals such as continuous read clock signals, with gating applied to the read clock signal to provide an idle mode for slave DLLs at the PHY.

Accordingly, it is intended by the appended claims to cover all modifications of the disclosed embodiments that fall within the scope of the disclosed embodiments.

What is claimed is:

1. A method for operating an interface circuit, comprising:
providing a master delay-locked loop (DLL) lock value indicating a delay adjustment made at a master DLL;
adjusting a delay of a slave DLL based on a master DLL code; and
temporarily enabling a replica phase detector at the slave DLL during an interface idle period, determining a slave DLL code, determining a configuration value based on the slave DLL code to the master DLL code, and then disabling the replica phase detector.

2. The method of claim 1, wherein:
the configuration value is based on an offset between the master DLL code and the slave DLL code.

3. The method of claim 2, further comprising:
applying a weighing coefficient to the configuration value when adjusting delay elements of the slave DLL.

4. The method of claim 1, wherein:
adjusting a delay of the slave DLL based on the master DLL code includes providing bias voltages for delay elements of the slave DLL based on the master DLL code and the configuration value.

5. The method of claim 1, further comprising:
saving the configuration value to register setting which is maintained during the interface idle period.

6. A clocking circuit for a communication link comprising:
a master delay-locked loop (DLL) circuit comprising a plurality of delay elements and a phase detector circuit for detecting a phase offset and providing a master DLL code for adjusting the delay elements of the master DLL;
a slave DLL circuit for providing an oscillator signal to a receiver of the communication link, the slave DLL circuit comprising a plurality of delay elements and a replica phase detector circuit for detecting a phase offset and providing a slave DLL code for adjusting the delay elements of the slave DLL circuit; and
an arbiter circuit operable to temporarily enable the replica phase detector circuit of the slave DLL circuit during an idle period of the communication link to update a configuration value based on the master DLL code and the slave DLL code.

7. The clocking circuit of claim 6, wherein:
the arbiter circuit is further operable to adjust the delay elements of the slave DLL circuit during an active period of the communication link based on the configuration value and the master DLL code; and
the configuration value is based on an offset between the master DLL code and the slave DLL code.

8. The clocking circuit of claim 7, wherein:
the arbiter circuit applies a weighing coefficient to the configuration value when adjusting the delay elements of the slave DLL.

9. The clocking circuit of claim 7, wherein:
the master DLL further comprises a digital-to-analog converter (DAC) for providing bias voltages for its delay elements based on the master DLL code; and
the slave DLL further comprises a DAC for providing bias voltages for its delay elements based on the master DLL code and the configuration value.

10. The clocking circuit of claim 9, wherein the replica phase detector circuit further comprises:
a phase detector providing an up-down signal indicating whether a delay of the delay elements should be increased or decreased; and
a digital logic circuit for producing the slave DLL code based on the up-down signal.

11. The clocking circuit of claim 6, wherein:
the arbiter circuit is operable to perform an initial calibration process to determine the configuration value to save the configuration value by enabling the replica phase detector circuit and producing the configuration value based on the master DLL code and the slave DLL code.

12. The clocking circuit of claim 6, wherein:
the arbiter circuit is operable to save the configuration value to register setting which is maintained during the idle period.

13. The clocking circuit of claim 6, wherein:
there are multiple instances of the slave DLL circuit each providing an oscillator signal to phase interpolators of respective receiver circuits for respective data (DQ) signals of a memory interface.

14. A data processing system, comprising:
a data processor;
a memory coupled to the data processor by a communication link; and
a clocking circuit for the communication link comprising:
a master delay-locked loop (DLL) circuit comprising a plurality of delay elements, and a phase detector circuit for detecting a phase offset and providing a master DLL code for adjusting the delay elements of the master DLL;
a slave DLL circuit for providing an oscillator signal to a receiver of the communication link, the slave DLL circuit comprising a plurality of delay elements, and a replica phase detector circuit for detecting a phase offset and providing a slave DLL code for adjusting the delay elements of the slave DLL circuit; and
an arbiter circuit operable to temporarily enable the replica phase detector circuit of the slave DLL circuit during an idle period of the communication link to update a configuration value based on the master DLL code and the slave DLL code.

15. The data processing system of claim 14, wherein:
the arbiter circuit is further operable to adjust the delay elements of the slave DLL circuit during an active period of the communication link based on the configuration value and the master DLL code; and
the configuration value is based on an offset between the master DLL code and the slave DLL code.

16. The data processing system of claim 15, wherein:
the arbiter circuit applies a weighing coefficient to the configuration value when adjusting the delay elements of the slave DLL.

17. The data processing system of claim 15, wherein:
the master DLL further comprises a digital-to-analog converter (DAC) for providing bias voltages for its delay elements based on the master DLL code; and
the slave DLL further comprises a DAC for providing bias voltages for its delay elements based on the master DLL code and the configuration value.

18. The data processing system of claim 17, wherein the replica phase detector circuit further comprises:
a phase detector providing an up-down signal indicating whether a delay of the delay elements should be increased or decreased; and
a digital logic circuit for producing the slave DLL code based on the up-down signal.

19. The data processing system of claim 14, wherein:
the arbiter circuit is operable to save the configuration value to register setting which is maintained during the idle period.

20. The data processing system of claim 14, wherein:
there are multiple instances of the slave DLL circuit each providing an oscillator signal to phase interpolators of respective receiver circuits for respective data (DQ) signals of a memory interface.

\* \* \* \* \*

UNITED STATES PATENT AND TRADEMARK OFFICE
CERTIFICATE OF CORRECTION

| | |
|---|---|
| PATENT NO. | : 11,909,404 B1 |
| APPLICATION NO. | : 18/079252 |
| DATED | : February 20, 2024 |
| INVENTOR(S) | : Andy Huei Chu, Pradeep Jayaraman and Karthik Gopalakrishnan |

It is certified that error appears in the above-identified patent and that said Letters Patent is hereby corrected as shown below:

In the Claims

In Claim 1, Column 9, Line 1, change "to" to --and--.

Signed and Sealed this
Twenty-sixth Day of March, 2024

Katherine Kelly Vidal
*Director of the United States Patent and Trademark Office*